United States Patent [19]

Kaiser

[11] 3,891,481

[45] June 24, 1975

[54] METHOD OF PRODUCING A SEMICONDUCTOR DEVICE

[75] Inventor: Reinhold Kaiser, Heilbronn, Germany

[73] Assignee: Telefunken Patentverwertungsgesellschaft mbH, Ulm, Danube, Germany

[22] Filed: Dec. 1, 1969

[21] Appl. No.: 881,147

[30] Foreign Application Priority Data

Dec. 2, 1968 Germany ............................ 1812059

[52] U.S. Cl. .................... 148/188; 148/187; 357/22

[51] Int. Cl. ................................................ H01l 7/44

[58] Field of Search ............................ 148/188, 187

[56] References Cited

UNITED STATES PATENTS

| | | | |
|---|---|---|---|
| 2,804,405 | 8/1957 | Derick et al. | 148/188 |
| 2,974,073 | 3/1961 | Armstrong | 148/188 |
| 3,001,896 | 9/1961 | Marinace | 148/188 |
| 3,070,466 | 12/1962 | Lyons | 148/188 |
| 3,287,187 | 11/1966 | Rosenheinrich | 148/188 |
| 3,387,358 | 6/1968 | Heiman | 29/571 |
| 3,404,451 | 10/1968 | So | 148/188 |
| 3,437,533 | 4/1969 | Dingwall | 148/188 |
| 3,532,564 | 10/1970 | Gittler | 148/188 |
| 3,575,742 | 4/1971 | Gilbert | 148/188 |

*Primary Examiner*—G. Ozaki
*Assistant Examiner*—J. M. Davis
*Attorney, Agent, or Firm*—Spencer and Kaye

[57] ABSTRACT

A method of producing a semiconductor device includes the steps of covering a limited portion of a semiconductor body with a layer containing diffusion impurities which are then diffused into the semiconductor body. By the use of the method once, a diode can be formed and by repeated use, a transistor or a plurality of diodes can be produced.

4 Claims, 9 Drawing Figures

Inventor:
Reinhold Kaiser

BY Spencer & Kaye
ATTORNEYS.

Inventor:
Reinhold Kaiser
BY Spencer & Kaye
ATTORNEYS.

Inventor:
Reinhold Kaiser

BY Spencer & Kaye ATTORNEYS.

METHOD OF PRODUCING A SEMICONDUCTOR DEVICE

BACKGROUND OF THE INVENTION

The invention relates to a method of producing a semiconductor device, wherein impurities are diffused into a limited area of a semiconductor body.

SUMMARY OF THE INVENTION

According to the invention, there is provided a method of producing a semiconductor device comprising covering a limited area of a semiconductor body with a layer containing diffusion impurities, and then diffusing said impurities into said semiconductor body in an oxidising atmosphere.

BRIEF DESCRIPTION OF THE DRAWINGS

The invention will now be described in greater detail, by way of example, with reference to the accompanying drawings, in which.

DESCRIPTION OF THE PREFERRED EMBODIMENTS

Figure 1:
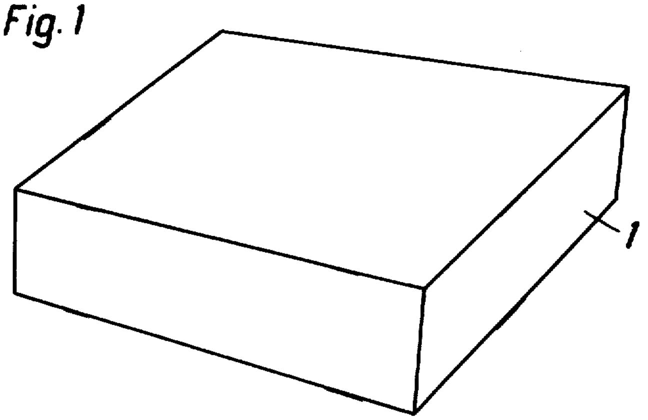
FIG. 1 is a perspective view, partly in section, of a first stage in the production of a diode in accordance with the invention.

Basically, the method of the invention consists in that a component area of one surface of the semiconductor body is covered with a layer containing the diffusion impurities and that when the impurities are diffused into the semiconductor body in an oxidising atmosphere.

The p-n junctions formed according to the present invention are planar p-n junctions, i.e., for any given junction the diffusion depth is the same for all points in the junction.

The invention has the advantage that disturbing contaminants which are incorporated in the oxide layer during the diffusion are removed with the oxide and that disturbing oxide stages are avoided.

According to a further development of the invention, the impurities are first diffused only into the surface region of the semiconductor body in a prediffusion taking place in an oxidising atmosphere but not yet down to the prescribed depth in the semiconductor. After this prediffusion, the layer containing the impurities and the oxide layer formed during the prediffusion are removed from the surface of the semiconductor and only after this are the impurities diffused into the semiconductor body diffused further into the semiconductor body down to the prescribed depth in a subsequent diffusion effected likewise in an oxidising atmosphere.

The layer containing the diffusion impurities may, for example, according to one embodiment of the invention, be first applied to the whole of one surface of the semiconductor body after which parts of this layer are removed in such a manner that only the portion of the layer necessary for the diffusion remains. This may be achieved, for example, by the fact that a photosensitive layer of lacquer is applied to the layer containing the diffusion impurities by the known photolacquer technique and is appropriately exposed and then developed.

In order to be able to make contact to the diffusion region produced in the semiconductor body, the oxide layer formed during the diffusion as well as the layer of impurities below it is provided with an aperture for making contact to the diffusion region. A metal is then introduced into this, for example by vapourdeposition or by precipitation.

In order to produce a diode according to the invention, a limited area of one surface of a semiconductor body of the first type of conductivity is covered with a layer which contains the diffusion impurities which produce the second type of conductivity in the semiconductor body. A region of the second type of conductivity is subsequently diffused into the semiconductor body from this layer in an oxidising atmosphere. In order to make contact to the diffusion region, the oxide layer formed during the diffusion as well as the impurity layer below it are provided with an aperture for making contact to the diffusion region and a metal is then introduced into this in order to produce an electrode. Contact is made to the semiconductor region of the first type of conductivity by providing an electrode on the semiconductor body, which electrode is provided for example at the side opposite to the region of the second type of conductivity.

In order to produce a plurality of diffusion regions in one semiconductor body, the invention is preferably used repeatedly. Thus in order to manufacture a transistor for example, a limited area of one surface of a semiconductor body of the type of conductivity of the collector region is covered with a layer which contains the diffusion impurities which produce the base region in the semiconductor body. Then the base region is diffused out of this layer into the semiconductor body in an oxidising atmosphere. After the base diffusion, the oxide layer formed during this diffusion is removed, together with the layer containing the diffusion impurities, from the surface of the semiconductor and then a limited area of this one surface of the semiconductor body is covered with a layer which contains the diffusion impurities which produce the emitter region in the semiconductor body. The emitter region is then diffused out of this layer into the semiconductor body in an oxidising atmosphere. Finally, in order to make contact to the base region and emitter region, apertures are formed in the oxide layer or in the impurity layer beneath it, into which contact material is introduced.

The invention is used for those semiconductor materials such as silicon, wherein a protective oxide layer develops on the surface of the semiconductor as a result of the oxidisation during diffusion in an oxidising atmosphere. The layer mixed with the diffusion impurities may consist for example of a glass compound such as a phosphate glass or a borate glass.

Figure 2:
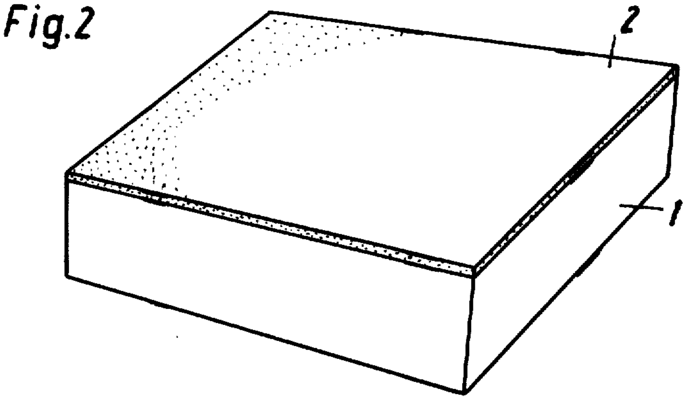
FIG. 2 is a view similar to FIG. 1 but showing a second production stage.

Referring now to FIG. 1 in order to produce a diode according to the invention, the starting point, is a semiconductor body 1 which consists of silicon for example. In order to produce a region which has the opposite type of conductivity to the semiconductor body in a limited area of the semiconductor body 1, a layer 2 is applied to the surface of the semiconductor, as shown in FIG. 2, which layer contains impurities which produce the opposite type of conductivity in the semiconductor body. If the semiconductor body 1 has p-type conductivity for example, then the layer 2 may, for example, consist of a phosphate glass because phosphorus produced n-type conductivity in the semiconductor body. Conversely, if the semiconductor body has n-type conductivity, then a layer of borate glass, for example, may be applied to the surface of the semiconductor because boron produced p-type conductivity in the semiconductor body.

Figure 3:
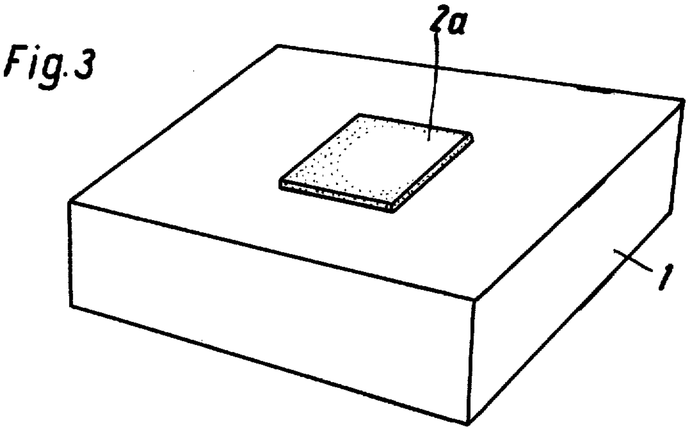
FIG. 3 is a view similar to FIG. 1 but showing a third production stage.

Since the impurities for producing the semiconductor region of the opposite type of conductivity are only to be diffused into a limited area of the semiconductor body, the layer 2, as shown in FIG. 2, must be restricted to the surface of this area. This may be achieved, for example, by the known photolacquer technique by applying a layer of photolacquer to the layer 2 in FIG. 2 - although this is not illustrated in the Figures - which is then so exposed and developed that only the area 2*a* as shown in FIG. 3 remains of the layer 2 of FIG. 2.

Figure 4:
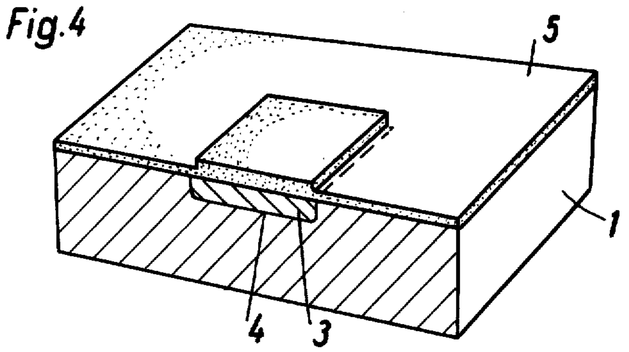
FIG. 4 is a view similar to FIG. 1 but showing a fourth production stage.

After the production of the smaller area 2*a*, a semiconductor region 3 which has the opposite type of conductivity to the semiconductor body 1 is diffused into the semiconductor body 1 as shown in FIG. 4. As a result, the p-n junction 4 necessary for the diode is formed between the semiconductor region 3 and the semiconductor body 1. The diffusion of the semiconductor region 3 is effected, according to the invention, in an oxidising atmosphere so that an oxide layer 5 is formed on the silicon body 1 as well as on the impurity area 2*a* as shown in FIG. 4. Finally, an aperture through which the semiconductor region 3 is exposed is formed in the oxide layer 2 as well as in the area 2*a* beneath it - not illustrated in FIG. 4 - in order to make contact to the semiconductor region 3. Contact is then made to the semiconductor region 3 by the fact that a contact metal is introduced into this aperture, for example by vapour deposition. In order to make contact to the semiconductor body 1, a large-area electrode, which is likewise not illustrated in FIG. 4, is applied to the semiconductor body 1, for example at the side opposite to the semiconductor region 3.

Whereas the former steps relate to the manufacture of a semiconductor diode, the manufacture of a transistor in accordance with the invention is described below. Since the first method steps for producing a transistor coincide with the manufacture of a diode, FIGS. 1 to 4 of the drawing may also be referred to for the manufacture of a transistor. In order to produce a transistor, the starting point, shown in FIG. 1, is a semiconductor body 1 which consists of silicon for example and which has the same type of conductivity as the collector region of the transistor. As shown in FIG. 2, a layer 2, which contains impurities which diffuse into the semiconductor body 1 under appropriate heating and there produce the base region, is applied to the one surface of the semiconductor body 1. Before the base diffusion, however, the impurity layer 2 of FIG. 2 must be reduced, as shown in FIG. 3, to a smaller area 2*a* in order that the base region, as is usual in the planar technique, may have a smaller cross-section than the semiconductor body. The reduction of the layer 2 to the smaller area 2*a* may again be effected, for example, by means of the known photolacquer technique wherein a photolacquer layer - not illustrated in the drawing - is applied to the layer 2 and then appropriately exposed and developed.

In the device shown in FIG. 4, the base region 3 is already diffused into the collector body 1 which consists of silicon for example. Since the base diffusion is effected in an oxidising atmosphere, the silicon body 1 is covered, on one surface, with a layer 5 of silicon dioxide which covers not only the semiconductor surface but also the impurity area 2*a*.

Figure 5:
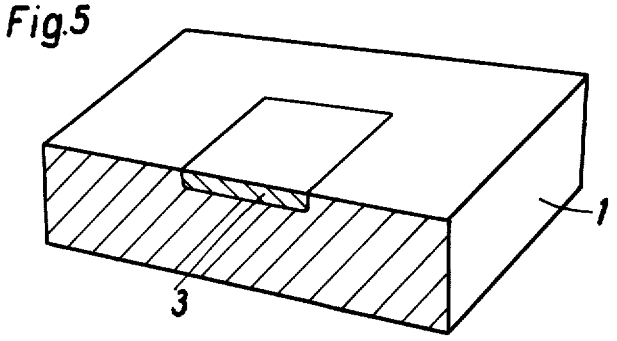
FIG. 5 is a view similar to FIG. 1 but showing a fifth production stage in the production of a transistor in accordance with the invention.
Figure 6:
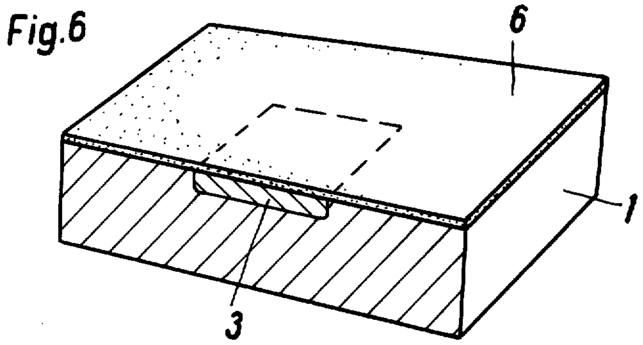
FIG. 6 is a view similar to FIG. 5 but showing a sixth production stage.
Figure 7:
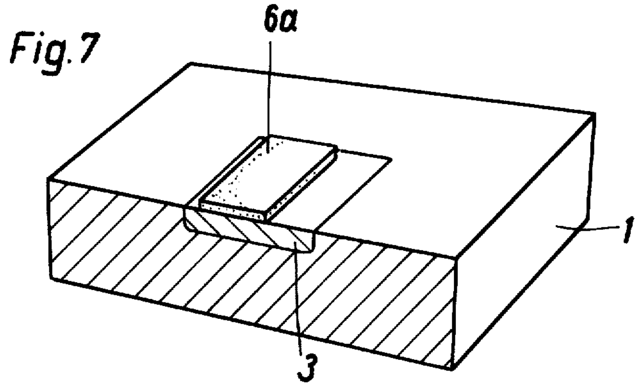
FIG. 7 is a view similar to FIG. 5 but showing a seventh production stage.
Figure 8:
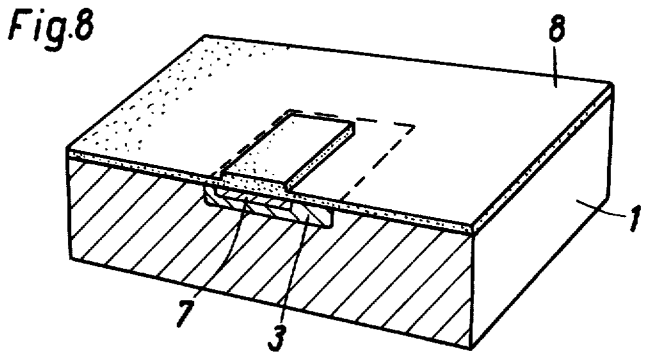
FIG. 8 is a view similar to FIG. 5 but showing an eighth production stage.

Following on the base diffusion, as shown in FIG. 5, the oxide layer 5 as well as the impurity area 2*a* is removed from the semiconductor surface so that an uncovered semiconductor body 1 with the base region 3 is obtained. In order to produce the emitter region, the method steps of FIGS. 1 to 4 are now repeated and first, as shown in FIG. 6, an impurity layer 6, which contains impurities which produce the emitter region in the semiconductor body, is applied to the one surface of the semiconductor body 1 of FIG. 5. As shown in FIG. 7, the impurity layer 6 is reduced so that the cross-section of the resulting area 6*a* corresponds to the cross-section of the emitter region to be produced. If the semiconductor body is now heated, impurities diffuse out of the impurity area 6*a* into the semiconductor body and there produce the emitter region 7. Since the emitter diffusion like the base diffusion according to the invention takes place in an oxidising atmosphere, an oxide layer 8 is also formed during the emitter diffusion as shown in FIG. 8, and covers both the semiconductor body 1 and also the impurity area 6*a*.

Figure 9:
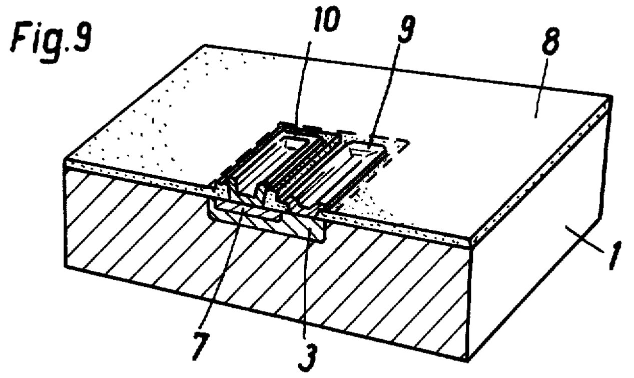
FIG. 9 is a view similar to FIG. 5 but showing the completed transistor.

In order to make contact to the base region and the emitter region, apertures which expose the base region and the emitter region for making contact are formed in the oxide layer 8 and in the impurity area 6*a* beneath it. Metal layers which form the base electrode 9 as well as the emitter electrode 10 are introduced into these apertures as shown in FIG. 9. Contact to the semiconductor body 1 and hence to the collector region is effected, for example, at the side opposite to the emitter region by providing a large-area electrode on the semiconductor body. Thus the transistor is finished except for the housing. The oxide layer 8 present on the surface of the semiconductor remains in all the devices according to the invention as does the insulating layer in the known planar transistors and planar diodes in order to protect the p-n junctions on the semiconductor body.

It will be understood that the above description of the present invention is susceptible to various modifications, changes and adaptations.

What I claim as new and desire to secure by Letters Patent of the United States is:

1. A method of producing a semiconductor device comprising covering a limited area of a semiconductor body with a layer containing diffusion impurities, and then diffusing said impurities into said semiconductor body in two stages, firstly diffusing only into the surface region of said semiconductor body in a prediffusion in an oxidising atmosphere to a depth short of the prescribed depth, secondly diffusing into said semiconductor body down to the prescribed depth in a subsequent diffusion likewise effected in an oxidising atmosphere and removing between said first and second stages said layer containing said impurities and an oxide layer formed during the prediffusion.

2. A method of producing a transistor comprising the steps of covering a limited area of one surface of a semiconductor body of the type of conductivity of the collector region with a layer which contains the diffusion impurities which produce the base region in said semiconductor body, diffusing said base region out of said layer into said semiconductor body in an oxidising atmosphere, removing an oxide layer formed during said diffusion together with said layer containing the diffusion impurities from the semiconductor surface, covering a limited area of said one surface of said semiconductor body with a further layer which contains the diffusion impurities which produce the emitter region in said semiconductor body, diffusing said emitter region out of said further layer into said semiconductor body in an oxidising atmosphere, and finally, forming apertures in a further oxide layer in order to make contact to said base region and said emitter region, the steps of diffusing being carried out as claimed in claim 1.

3. A method of producing a semiconductor device comprising covering a limited area of a semiconductor body with a layer containing diffusion impurities, and then diffusing said impurities into said semiconductor body for forming a planar p-n junction, the diffusing being carried out in two stages, firstly, diffusing only into the surface region of said semiconductor body in a prediffusion in an oxidising atmosphere to a depth short of the prescribed depth; secondly, diffusing into said semiconductor body down to the prescribed depth in a subsequent diffusion likewise effected in an oxidising atmosphere and removing between said first and second stages said layer containing said impurities and an oxide layer formed during the prediffusion.

4. A method of producing a transistor comprising the steps of covering a limited area of one surface of a semiconductor body of the type of conductivity of the collector region with a layer which contains the diffusion impurities which produce the base region in said semiconductor body, diffusing said base region out of said layer into said semiconductor body in an oxidising atmosphere, removing an oxide layer formed during said diffusion together with said layer containing the diffusion impurities from the semiconductor surface, covering a limited area of said one surface of said semiconductor body with a further layer which contains the diffusion impurities which produce the emitter region in said semiconductor body, diffusing said emitter region out of said further layer into said semiconductor body in an oxidising atmosphere, and finally, forming apertures in a further oxide layer in order to make contact to said base region and said emitter region, the steps of diffusing being carried out as claimed in claim 3.

* * * * *